United States Patent
Lee

(10) Patent No.: US 9,773,961 B1
(45) Date of Patent: Sep. 26, 2017

(54) DISPLAY PANEL

(71) Applicant: RITDISPLAY CORPORATION, Hsin Chu Industrial Park (TW)

(72) Inventor: Chih-Yen Lee, Xinfeng Township (TW)

(73) Assignee: RITDISPLAY CORPORATION, Hsin Chu Industrial Park (TW)

( * ) Notice: Subject to any disclaimer, the term of this patent is extended or adjusted under 35 U.S.C. 154(b) by 0 days.

(21) Appl. No.: 15/359,168

(22) Filed: Nov. 22, 2016

(30) Foreign Application Priority Data

Mar. 16, 2016 (TW) .............................. 105108077 A

(51) Int. Cl.
| | | |
|---|---|---|
| *H01L 29/205* | (2006.01) | |
| *H01L 33/62* | (2010.01) | |
| *H01L 27/15* | (2006.01) | |
| *H01L 33/38* | (2010.01) | |

(52) U.S. Cl.
CPC ............ *H01L 33/62* (2013.01); *H01L 27/156* (2013.01); *H01L 33/38* (2013.01)

(58) Field of Classification Search
CPC ... H01L 27/32; H01L 27/3227; H01L 27/288; H01L 27/323; H01L 27/156
See application file for complete search history.

(56) References Cited

U.S. PATENT DOCUMENTS

| | | | | |
|---|---|---|---|---|
| 2014/0327649 A1* | 11/2014 | Lee | .......................... | G06F 3/044 345/174 |
| 2015/0069362 A1* | 3/2015 | Ito | .......................... | H01L 27/323 257/40 |
| 2017/0040535 A1* | 2/2017 | Ogita | ................... | C07D 307/77 |
| 2017/0060329 A1* | 3/2017 | Yoon | ..................... | G06F 3/0416 |
| 2017/0102797 A1* | 4/2017 | Cok | ....................... | G06F 3/0412 |
| 2017/0185193 A1* | 6/2017 | Kim | ...................... | G06F 3/0412 |

\* cited by examiner

*Primary Examiner* — Trung Q Dang

(74) *Attorney, Agent, or Firm* — Hanley, Flight & Zimmerman, LLC

(57) ABSTRACT

A display panel includes a substrate, conducting wires, a first insulation layer, a second insulation layer, first electrode series, light emitting units and second electrode series. Interval zones and light emitting zones are defined on the substrate. The first insulation layer is disposed on the substrate. The conducting wires are disposed on the first insulation layer. Each second electrode series includes at least one pad. Each conducting wire includes a first trace part, extending along a first direction, and a second trace part, extending along a second direction. Part of the first trace part is in one of the interval zones. The second trace part is in one of the interval zones. The one end of the second trace part is connected to the first trace part and the other end is connected to one of the pads of one of the second electrode series.

14 Claims, 9 Drawing Sheets

DISPLAY PANEL

CROSS-REFERENCE TO RELATED APPLICATIONS

This non-provisional application claims priority under 35 U.S.C. §119(a) on Patent Application No(s). 105108077 filed in Taiwan R.O.C. on Mar. 16, 2016, the entire contents of which are hereby incorporated by reference.

BACKGROUND

Technical Field

This disclosure relates to a display panel, and more particularly to a display panel with conducting wires.

Related Art

Following the vigorous development of display techniques, display panels are applied to many different kinds of electronic devices, such as televisions, monitors, laptops, cell phones. Among these different electronic devices, the display panels have different sizes and scales. Besides the resolution, the contrast and the viewing angle, consumers have expectation of the appearance of display panels. The consumers usually desire for the display panels with narrow borders or even without border to fit their aesthetic. Also, the display panel can be light and small.

To make display panels have narrow borders, the manufacturer generally reduce the area of surrounding traces of a display panel and then the border width reduces. In conventional fabrication, the intervals and the width of surrounding traces are reduced by yellow light manufacturing process to reduce the border width. However, following the increased resolution of display panels, the number of surrounding traces also increases. Then, the intervals and the width of surrounding traces become smaller and smaller. Therefore, manufacturing display panels by conventional methods easily causes the problems such as too narrow width of surrounding traces or breaks in surrounding traces and decreases the quality of display panels.

SUMMARY

This disclosure provides a panel including a substrate, a first insulation layer, a second insulation layer, multiple first electrode series, multiple light emitting units and multiple second electrode series. Multiple interval zones and multiple light emitting zones are defined on the substrate. The first insulation layer is disposed on the substrate. Multiple conducting wires are disposed on the first insulation layer. The second insulation layer is disposed in the interval zones of the substrate, and covers the conducting wires and the first insulation layer. Each of the first electrode series extends along a first direction and comprises multiple first electrode units. Each of the first electrode units is correspondingly disposed in one of the light emitting zones. The light emitting units are disposed in the light emitting zones and on the first electrode units of the first electrode series. The second electrode series extends along a second direction, and covers the light emitting units in the light emitting zones. Each of the second electrode series includes at least one pad. Each of the conducting wires includes a first trace part and a second trace part. The first trace part extends along the first direction. Part of the first trace part is disposed in one of the interval zone. The first end of the second trace part is connected to the first trace part and the second trace part extends along the second direction. The second trace part is disposed in one of the interval zones and the second end, of the second trace part is connected to the pad of one of the second electrode series.

In an embodiment of the disclosure, the first insulation layer of the display panel covers part of the first electrode series. Besides, the display panel further includes multiple isolating units. The isolating units are disposed up the first electrode series and the first insulation layer and each of the isolating units extends along the second direction. Moreover, the second trace part of each of the conducting wires is under one of the isolating units. For example, a display panel has N of second electrode series and N of conducting wires, and each of the second electrode series has a first end and a second end. The (i−1)th conducting wire is connected to the pad on the first end of the (i−1)th second electrode series and the ith conducting wire is connected to the pad on the second end of the ith second electrode series, wherein N and i are positive integer. As another example, the jth conducting wire is connected to the pad on the first end of the jth second electrode series and the pad on the second end of the ith second electrode series, wherein N and j are positive integer, and j is not larger than N.

In another embodiment, each of the first groups includes multiple first conducting wires and the first conducting wires in each of the plurality of first groups are adjacent to one another. Each of the second groups includes multiple second conducting wires and the second conducting wires in each of the plurality of second groups are adjacent to one another. Each of the serial groups includes multiple second electrode series and the second electrode series in each of the serial groups are adjacent to one another.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
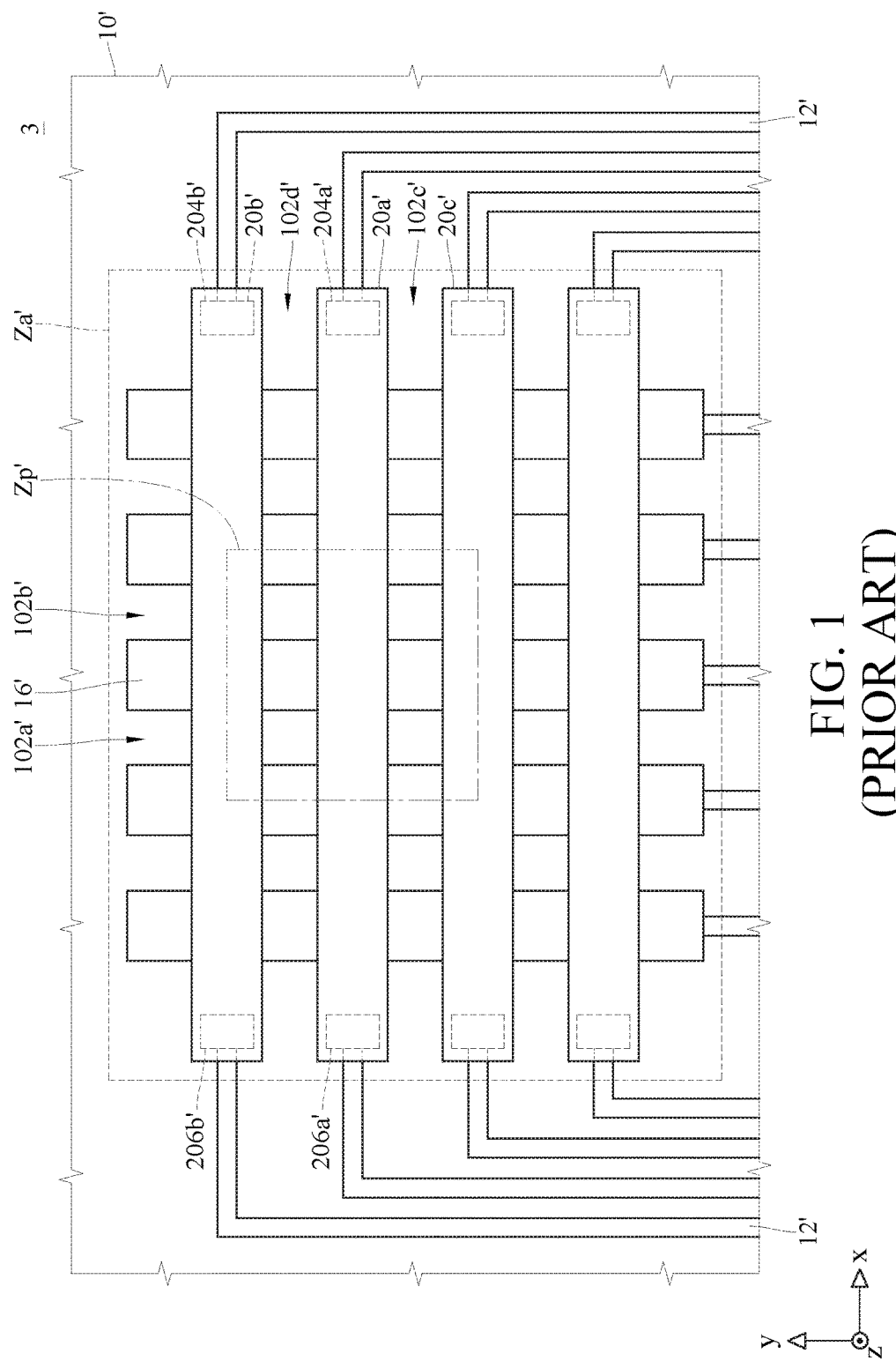
FIG. 1 is a schematic diagram of relationship between part units of a display panel in prior art.

Please refer to FIG. 1, a schematic diagram of relationship between part of units of a display panel in prior art. As shown in FIG. 1, in a conventional display panel 3, conducting wires 12' are mainly disposed in the trace zone outside display zone Za'. The conducting wires 12' mainly disposed in the trace zone on the both sides of the display zone Za'. This kind of wiring results in the trace zone outside the display zone Za' partly occupied by the conducting wires 12' so the border width of the conventional display panel 3 cannot be reduced. The conventional display panel 3 includes a substrate 10', the conducting wires 12', first electrode series 16' and second electrode series 20a', 20b', 20c'. The relationship between the above units is simply shown in FIG. 1. The display zone Za' is disposed on the substrate 10'. The display zone Za' includes interval zones 102a', 102b', 102c', 102d'. The second electrode series 20a' includes pad 204a', 206a' and the second electrode series 20b' includes pad 204b', 206b'. Region Zp' is corresponding to the following statement. Please refer to the following statement of related units.

Figure 2A:
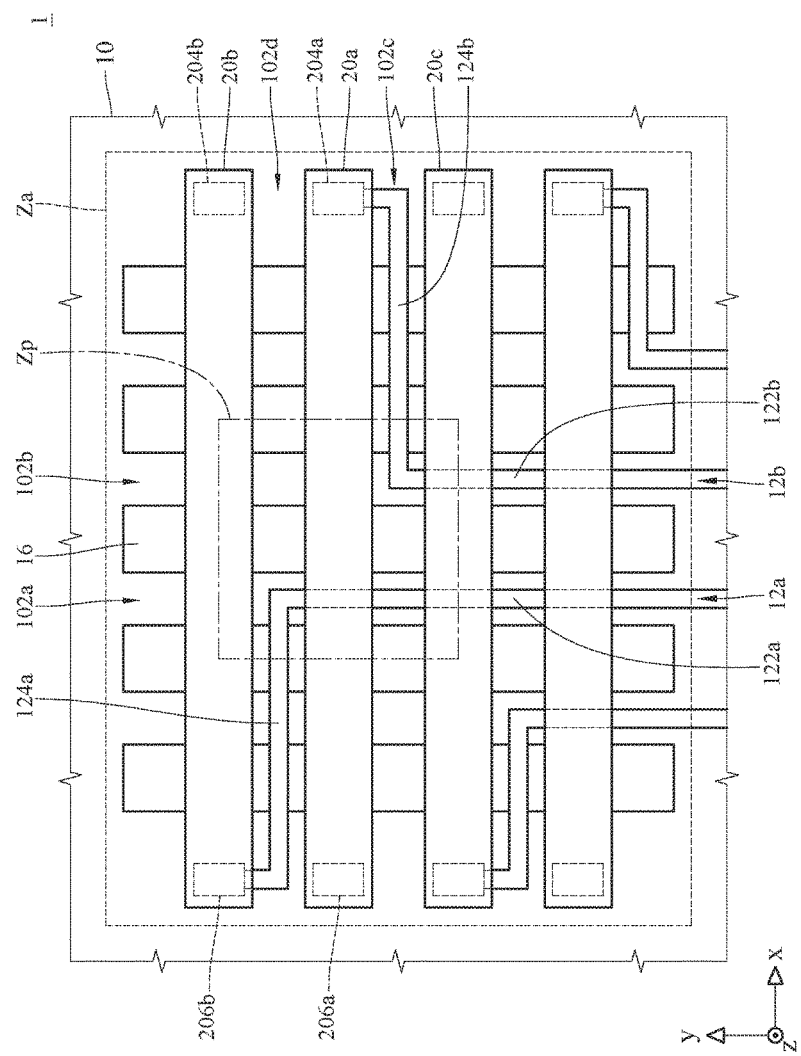
FIG. 2A is a schematic diagram of relationship between part units of a display panel in an embodiment of this disclosure.
Figure 2B:
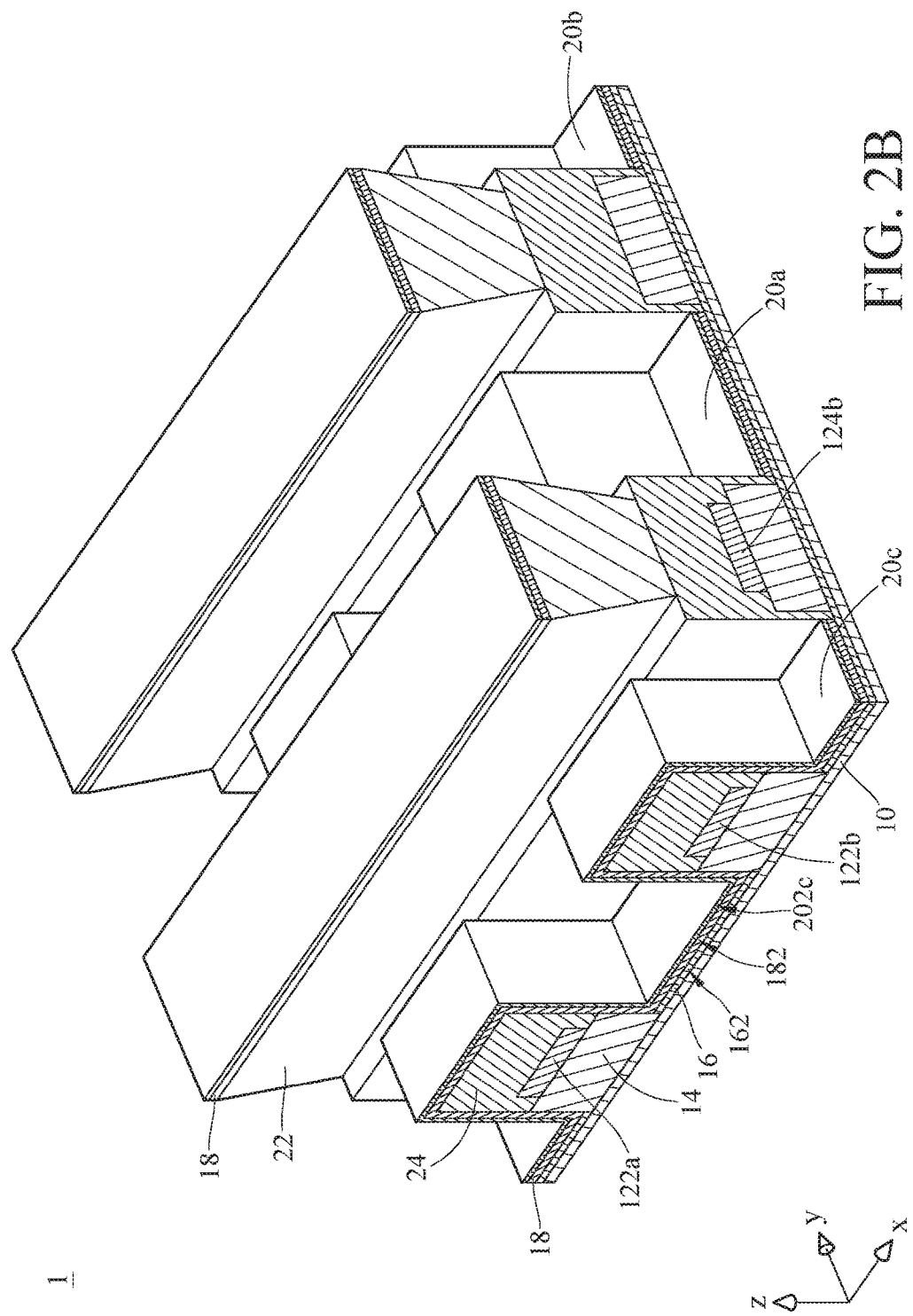
FIG. 2B is a part perspective view corresponding to the part region of the display panel in FIG. 2A.
Figure 3:
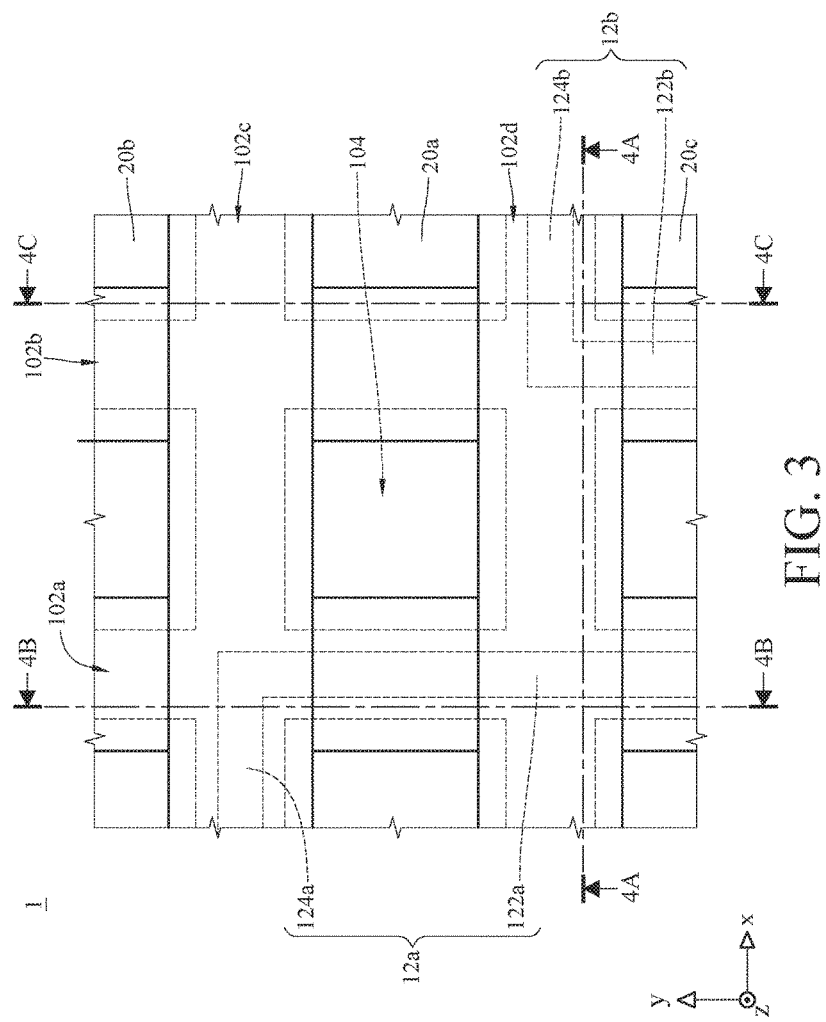
FIG. 3 is a part top view of the display panel in FIG. 2B.

Please refer to FIG. 2A, FIG. 2B and FIG. 3. FIG. 2A is a schematic diagram of relationship between part units of a display panel in an embodiment of this disclosure. FIG. 2B is a part perspective view corresponding to the part of region of the display panel in FIG. 2A. FIG. 3 is a part top view of the display panel in FIG. 2B. FIG. 2B shows the part perspective view corresponding to the region Zp in FIG. 2A and FIG. 3 is the top view of the display panel in FIG. 2B. As shown in FIG. 2A and FIG. 2B, the display panel 1 includes a substrate 10, conducting wires 12a, 12b, a first insulation layer 14, first electrode series 16, light emitting material series 18, second electrode series 20a, 20b, 20c, isolating units 22 and a second insulation layer 24. To simplify description, FIG. 2A, FIG. 2B and FIG. 3 just show the part region and part units of the display panel 1, and the repeat units or the parts of structure are mentioned to explain the embodiment. Person having ordinary skill in the art can get complete structure and related functions of the display panel 1 based on the description of this specification and the figures.

The following statement is about the structure of the display panel 1 according to FIG. 2A. The display zone Za of the substrate 10 of the display panel 1 includes interval zones 102a, 102b, 102c, 102d and light emitting zone 104. The interval zones 102c, 102d extend along x axis and the interval zones 102a, 102b extend along y axis. As shown in figure, the interval zones 102a, 102b and the interval zones 102c, 102d cross each other, and the interval zones 102a, 102b, 102c, 102d surround the light emitting zone 104. This disclosure does not intend to limit the aspect ratio of the interval zone 102a-102d and the light emitting zone 104. The substrate 10 is such as a glass substrate but not limited in this disclosure. As the above statement, just the interval zone 102a-102d and the light emitting zone 104 are mentioned as an example here, but in fact, the display panel 1 includes not only the interval zone 102a-102d and the light emitting zone 104 but more interval zones and light emitting zones.

The first electrode series 16 extends along y axis, and the second electrode series 20a, 20b, 20c extend along x axis. The first electrode series 16 and the second electrode series 20a, 20b, 20c cross each other. The light emitting zone 104 is at the intersection. The second electrode series 20a includes pads 204a, 206a and the second electrode series 20b includes pad 204b, 206b. The pads 204a, 206a are respectively disposed at the two opposite ends of the second electrode series 20a. Similarly, the pads 204b, 206b are respectively disposed at the two opposite ends of the second electrode series 20b.

The first electrode series 16 is made of metal, indium tin oxide (ITO), indium gallium zinc oxide (IGZO), or indium tin zinc oxide (ITZO) for example. The second electrode series 20a, 20b, 20c are made of aluminum (Al) or other depositable material. The pads 204a, 206a, 204b, 206b can be made of the same material as the material of the second electrode series 20a, 20b, 20c, or the different material from the material of the second electrode series 20a, 20b, 20c. The pads 204a, 206a, 204b, 206b is made of mental or alloy with conductivity, such as Al, molybdenum (Mo), or other depositable material. The above statement is just as example and this disclosure does not intend to limit the material of first electrode series, second electrode series and pads.

The first insulation layer 14 is disposed on the substrate 10. The first insulation layer 14 is made of antioxidant polymers, such as silicon dioxide ($SiO_2$), epoxy, unsaturated polyester resin, ceramic material, fibre-reinforced plastic, Teflon, polyimide, or other isolating material. The conducting wires 12a, 12b are disposed on the first insulation layer 14. The conducting wires 12a, 12b are used for transmitting signals. Please refer to the later description of the structure for the related details. The conducting wires 12a, 12b are made of mental or alloy with conductivity, such as Al, Mo, or other depositable material. This disclosure does not intend to limit the material of the first insulation layer and the conducting wires. The conducting wires 12a, 12b respectively include first trace parts 122a, 122b and second trace parts 124a, 124b. The first end of each of the second trace parts 124a, 124b is respectively coupled to the first trace part 122a, 122b.

As shown in FIG. 2B, the first trace parts 122a, 122b extend along y axis, and part of the first trace part 122a and part of the first trace part 122b are respectively disposed in the interval zones 102a, 102b. The second trace parts 124a, 124b extend along x axis and the second trace parts 124a, 124b are respectively disposed in the interval zones 102d, 102c. As shown in FIG. 2A, in this embodiment, the conducting wires 12a, 12b are respectively coupled to the pads 204a, 206b of the second electrode series 20b, 20a via the second trace part 124a, 124b. In other words, the conducting wires 12a, 12b extend to the display zone Za via the interval zone 102a, 102b respectively, and then extend along changed direction to be coupled to the pads 204a, 206b on the corresponding second electrode series 20a, 20b via the interval zones 102d, 102c respectively. Although the above example describes that an interval zone is disposed only one conducting wire, each interval zone can be disposed multiple conducting wires in practice. This disclosure does not intend to limit the number of the conducting wires disposed in an interval zone.

In an embodiment, the conducting wires 12a, 12b are electrically coupled to a driver circuit via the end which is outside the display zone Za. In other words, the conducting wires 12a, 12b are used for transmitting a drive signal from the driver circuit to make the second electrode series 20a, 20b have relative voltage. As a result, pixel units or light emitting units in the display zone Za can selectively emit light. This disclosure does not intend to limit whether the driver circuit is made of external driver integrated circuit (driver IC) or gate on array (GOA).

Figure 4A:
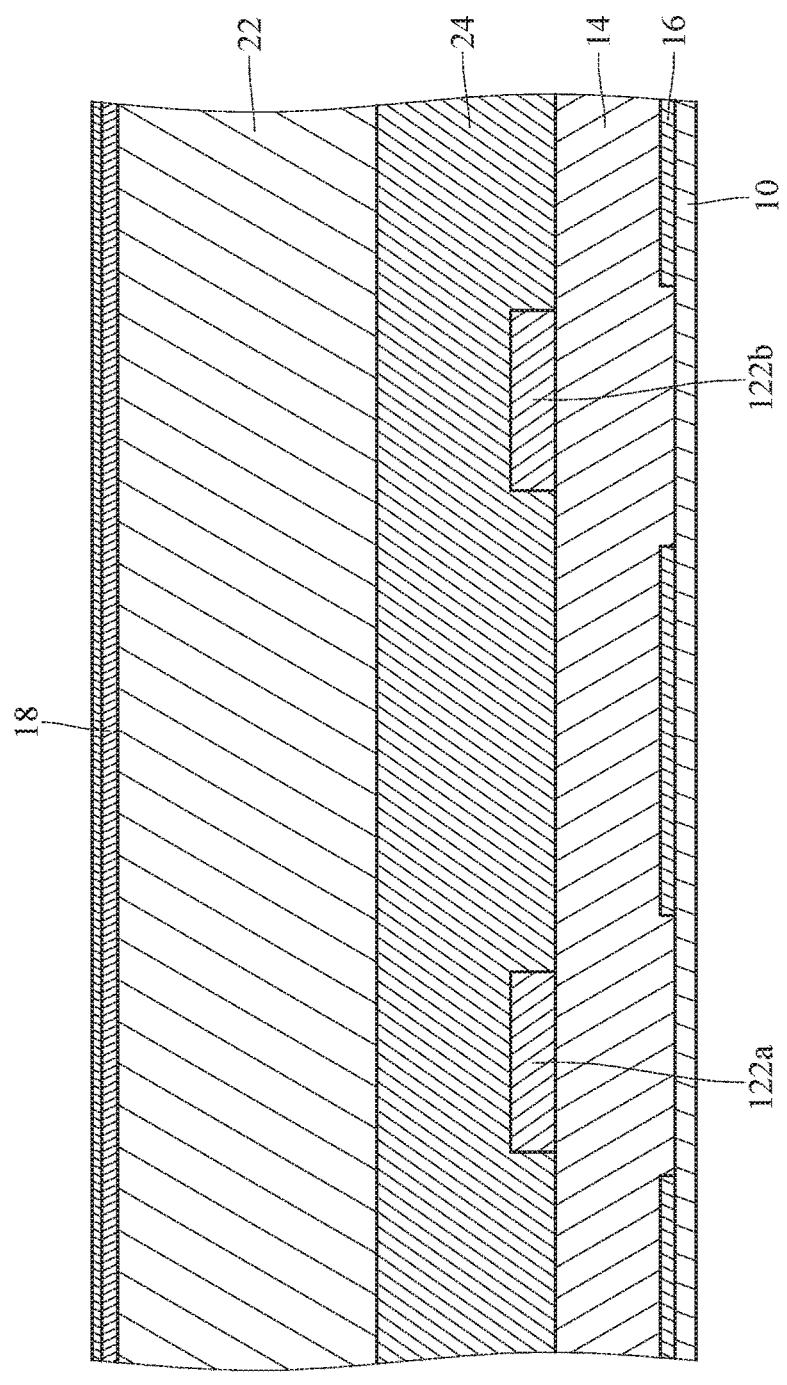
FIG. 4A is a sectional view of the display panel corresponding to section line 4A-4A in FIG. 3.
Figure 4B:
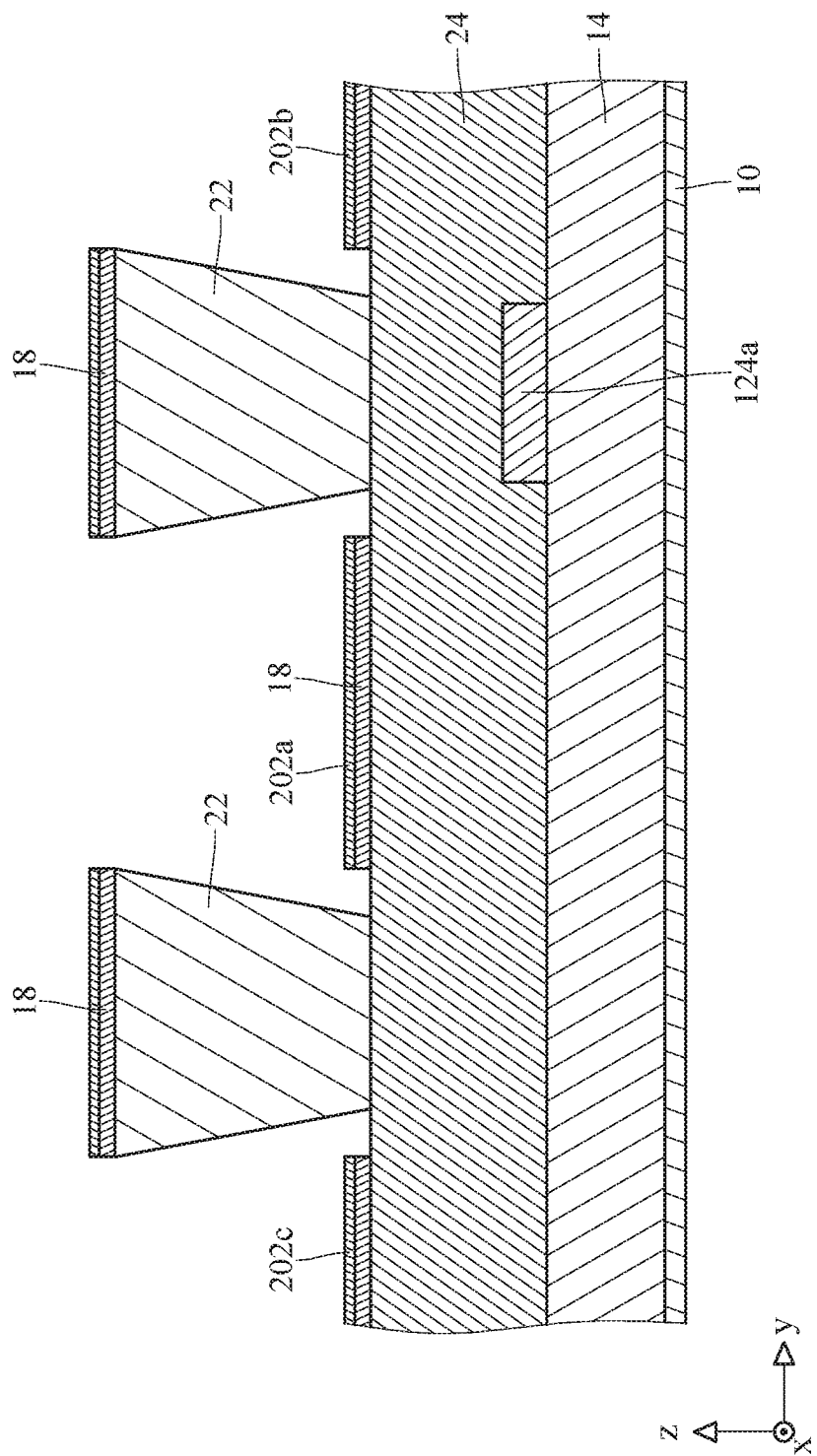
FIG. 4B is a sectional view of the display panel corresponding to section line 4B-4B in FIG. 3.
Figure 4C:
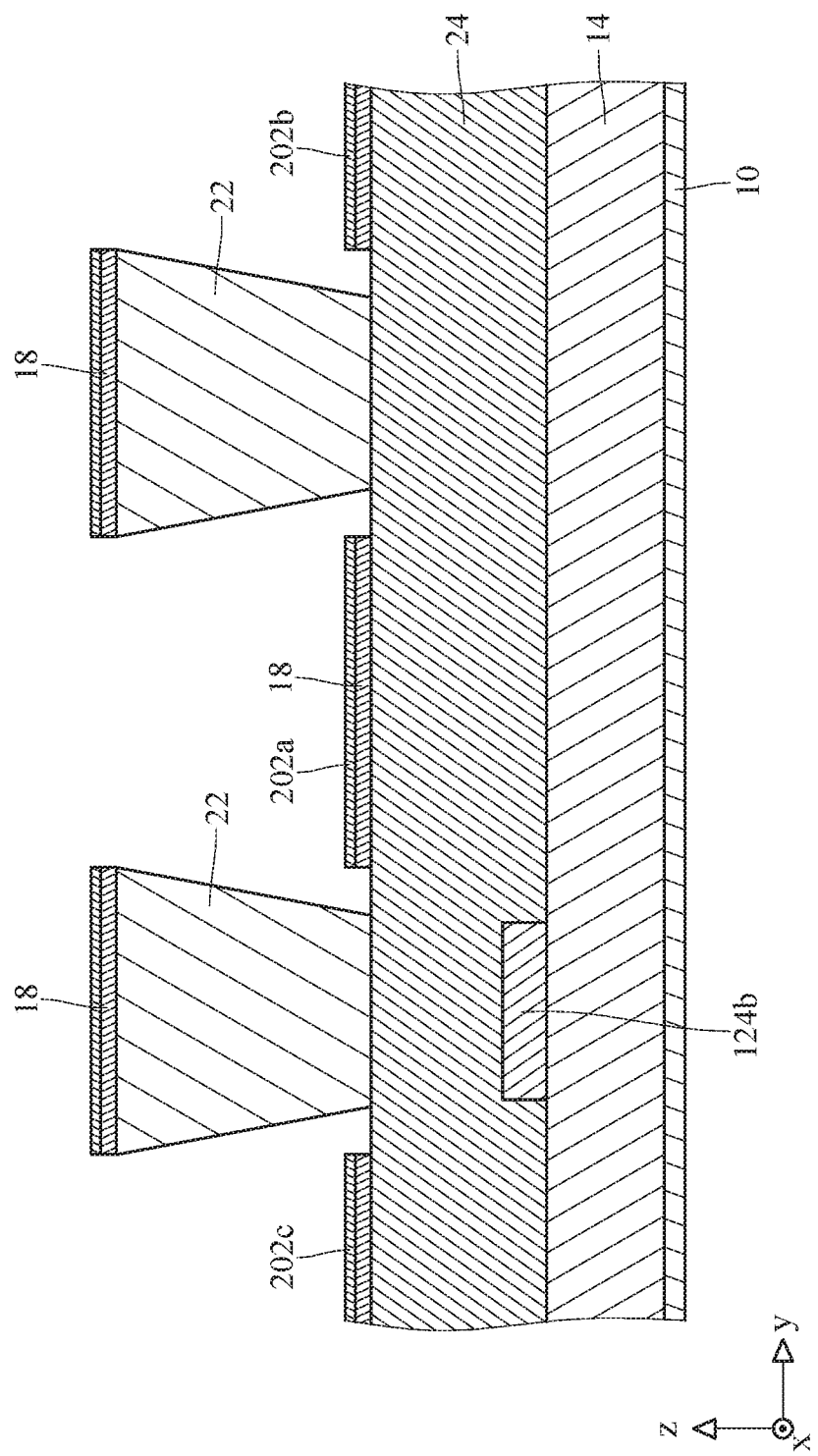
FIG. 4C is a sectional view of the display panel corresponding to section line 4C-4C in FIG. 3.

Please refer to FIG. 4A, FIG. 4B and FIG. 4C for the description of the detailed structure of the display panel 1.

FIG. 4A is a sectional view of the display panel corresponding to section line 4A-4A in FIG. 3. FIG. 4B is a sectional view of the display panel corresponding to section line 4B-4B in FIG. 3. FIG. 4C is a sectional view of the display panel corresponding to section line 4C-4C in FIG. 3. The units in FIG. 3 are corresponding to the units in FIG. 2A so the related details are not described again. To simplify description, when there are multiple same units, one of them is described in the following statement.

In fact, other units of the same type can be deduced by analogy.

As shown in FIG. 2B to FIG. 4C, the first electrode series 16 is disposed on the substrate 10. The first electrode series 16 includes multiple first electrode units. The first electrode units are coupled to one another via the remained part of the first electrode series 16. The following statement refers to a first electrode unit 162 to illustrate. Corresponding to the substrate 10, the first electrode unit 162 is disposed in a light emitting zone 104. Because the first electrode series 16 extends along y axis, the first electrode series 16 roughly parallel with the first trace parts 122a, 122b, which also extend along y axis. Besides, the first electrode series 16 and the first trace part 122a, 122b are staggeredly arranged on x axis.

The first insulation layer 14 is disposed on the substrate 10 and covers part of the first electrode series 16. Please refer to FIG. 2B. In FIG. 2B, the first insulation layer 14 roughly has a grid-like structure and not covers the light emitting zone 104, so the first electrode series 16, which is disposed in the light emitting zone 104, is exposed from the first insulation layer 14, and the first electrode unit 162 is exposed from the first insulation layer 14.

As described before, the conducting wires 12a, 12b are disposed on the first insulation layer 14. The details of wiring related to the conducting wires 12a, 12b is as the above statement, so the details are not described again. The first electrode series 16 and the conducting wires 12a, 12b are isolated from each other by the first insulation layer 14.

The second insulation layer 24 is disposed in the interval zone 102a-102d and covers at least part of the conducting wires 12a, 12b. In other words, the conducting wire 12a is buried between the first insulation layer 14 and the second insulation layer 24 and the first electrode series 16a and the conducting wires 12a are isolated from each other by the first insulation layer 14. Moreover, the second insulation layer 24 is disposed correspondingly to the interval zone 102a-102d. Similar to the first insulation layer 14, in this embodiment, the second insulation layer 24 is roughly grid-like. The part of the first electrode series 16 which is disposed light emitting zone 104 is exposed with the cover of the second insulation layer 24. Besides, the first electrode unit 162 is exposed from the first insulation layer 14.

The isolating unit 22 extends along x axis and is disposed on the second insulation layer 24. As shown in figure, besides the isolating unit 22, the display panel 1 further includes other isolating units. Each isolating unit and each first electrode series are staggeredly arranged but only the isolating unit 22 is mentioned as an example. In an embodiment corresponding to FIG. 4A, FIG. 4B and FIG. 4C, the isolating unit 22 extends along x axis. In another embodiment, the isolating unit 22 extends along the direction which is not limited in this disclosure according to the direction along which the first electrode series 16 or the second electrode series 20a, 20b, 20c extends. As shown in FIG. 4B and FIG. 4C, the YZ cross-section of the isolating unit 22 is a trapezoid roughly and the shorter side of the trapezoid contacts the second insulation layer 24. In this embodiment, the second trace parts 124a, 124b are under the isolating unit 22.

As shown in figures, the light emitting material series 18 is disposed up the second insulation layer 24 and the first electrode series 16. More specifically, during fabrication, the conducting wires 12a, 12b, the first insulation layer 14, the first electrode series 16, the second insulation layer 24 and the isolating unit 22 are disposed at the display panel 1 as the structure mentioned before. Next, the light emitting material is deposited on the display panel 1 with related manufacturing process. At the same time, the light emitting material is deposited on the second insulation layer 24, the first electrode series 16 and the isolating unit 22. The drops of the structure, which result from each layer stacking up, make the light emitting material on the isolating unit 22 not continuous with the light emitting material on other parts. As mentioned before, the first insulation layer 14, the first electrode series 16, the second insulation layer 24 and the isolating unit 22 generally refer to all of the first insulation layers, the first electrode series, the second insulation layers and the isolating units. Although the conducting wires 12a, 12b and the second electrode series 20a, 20b, 20c respectively refer to the specific conducting wires and the specific second electrode series, person having ordinary skill in the art can deduce all of the conducting wires and the second electrode series based on the related statement of the conducting wires 12a, 12b and the second electrode series 20a, 20b, 20c after referring to this specification.

The light emitting material is divided into sections, as the light emitting material series 18, by the isolating unit 22. The light emitting material series 18 are disposed high or low according to the drops of the structure of the display panel. The part of the light emitting material series 18 which is in the light emitting zone 104 is defined as the light emitting unit 182. In an embodiment, the light emitting unit 182 includes hole transport layer (HTL), emission layer (EL) and electron transport layer (ETL) wherein the emission layer is made of organic light emitting material. This disclosure does not intend to limit the composition of each layer of the light emitting material series 18.

Please refer to FIG. 2B to FIG. 4C. The second electrode series 20a, 20b, 20c are disposed at the display panel 1 by the method for disposing the light emitting material series 18 so the details are not described again. As shown in figures, the second electrode series 20a, 20b, 20c are disposed on the light emitting material series 18 and the second electrode series 20a, 20b, 20c extend along x axis. Thus, the second electrode series 20a, 20b, 20c cross the first electrode series 16. Moreover, the light emitting material series 18 is disposed between the second electrode series 20a, 20b, 20c and the first electrode series 16. The second electrode series 20a, 20b, 20c are isolated from the first electrode series 16. Besides, the second insulation layer 24 covers the conducting wires 12a, 12b, so the second electrode series 20 are roughly isolated from the conducting wires 12a, 12b. The conducting wires 12a, 12b are coupled to the pads 204a, 206a, 204b, 206b of the second electrode series 20a, 20b, 20c via two ends. In an embodiment, the conducting wires 12a, 12b pass through the second insulation layer 24 and are respectively coupled to the pads 206a, 206b and the pads 204a, 204b according to process plan. In another embodiment, the conducting wires 12a, 12b bypass the second insulation layer 24 and are respectively coupled to the pads 206a, 206b and the pads 204a, 204b according to process plan. The above statement is just as example. The disclosure does not intend to limit the process plan. The second electrode series 20a, 20b, 20c are roughly parallel with the second trace parts 124a, 124b, which also extend along x axis. Besides, the second electrode series 20a, 20b, 20c and the second trace part 124a, 124b are staggeredly arranged on y axis.

In addition, the second electrode series 20a, 20b, 20c include multiple second electrode units. The second electrode units are respectively disposed in the different light emitting zones and are coupled to one another via the remained part of the second electrode series 20a, 20b, 20c. FIG. 4B and FIG. 4C show second electrode units 202a, 202b, 202c, which are respectively corresponding to the second electrode series 20a, 20b, 20c. The second electrode unit 202c is referred to as an example in the following statement. The second electrode unit 202c is disposed in the light emitting zone 104 and on the light emitting unit 182. In other words, the light emitting unit 182 is disposed between the first electrode unit 162 and the second electrode unit 202c. The light emitting unit 182 emits light based on the voltage difference between the first electrode unit 162 and the second electrode unit 202c wherein the voltage level of the second electrode unit changes based on the voltage level of the coupled conducting wires.

To make statement clear, the second electrode unit 202c, the light emitting unit 182 and the first electrode unit 162 in above figures have the same area and shape. However, in fact, this disclosure does not intend to limit the size of area and the shape of the second electrode unit 202c, the light emitting unit 182 and the first electrode unit 162 in FIG. 2A.

Figure 5:
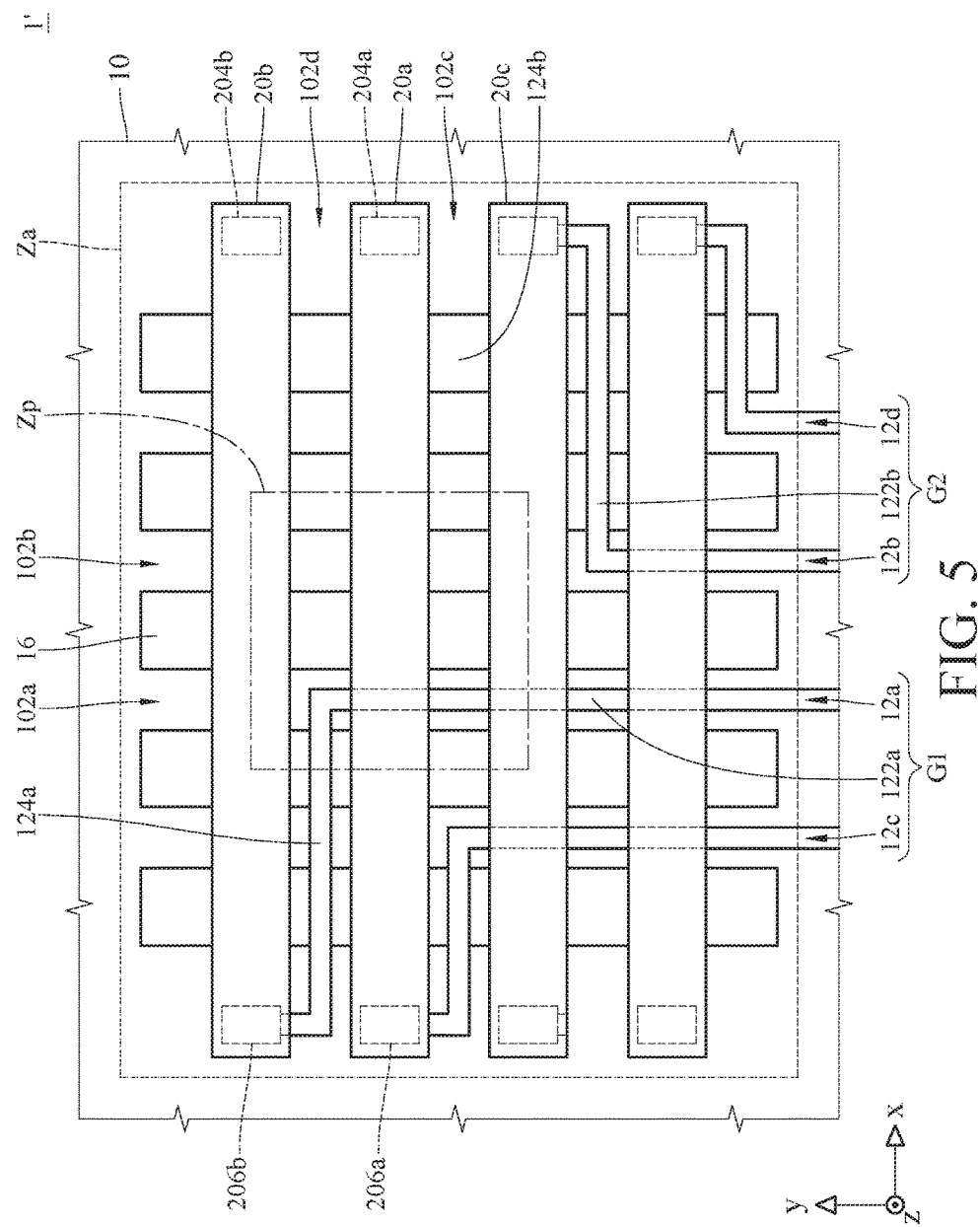
FIG. 5 is a schematic diagram of relationship between part units of a display panel in another embodiment of this disclosure.

Besides the above embodiments, the display panel provided in this disclosure has other layout of conducting wires based on the same concept. Please refer to FIG. 5, a schematic diagram of relationship between part units of a display panel in another embodiment of this disclosure. The structure of the display panel 1' shown in FIG. 5 is similar to the display panel 1 mentioned before, so the details of related units are not described again. In an embodiment shown in FIG. 5, each of the second electrode series 20a-20c respectively includes a first end and a second end. Refer to the second electrode series 20a, for example, the end at which the pad 204a is disposed is one of the first end and the second end. The end at which the pad 206a is disposed is the other one of the first end and the second end. To simplify statement, the first end of the second electrode series 20a is defined as the end at which the pad 206a is disposed, and the second end of the second electrode series 20a is defined as the end at which the pad 204a is disposed. The conducting wires are respectively defined as multiple first conducting wires and multiple second conducting wires. Each of the first conducting wires is coupled to the pad at the first end of one of the second electrode series. Each of the second conducting wires is coupled to the pad at the second end of one of the second electrode series. As shown in FIG. 4, conducting wire 12a and conducting wire 12c are defined as the first conducting wires. Conducting wire 12b and conducting wires 12d are defined as the second conducting wires. The conducting wire 12a and conducting wire 12c, which are defined as the first conducting wires, are adjacent to each other. The conducting wire 12b and conducting wires 12d, which are defined as the second conducting wires, are adjacent to each other. The above statement is just as an example and this disclosure does not intend to limit the number of the conducting wires.

All of the first conducting wires are further divided into multiple first groups and each of the first groups includes at least one first conducting wire. All of the second conducting wires are further divided into multiple second groups and each of the second groups includes at least one second conducting wire. All of the second electrode series are further divided into multiple serial groups and each of the serial groups includes at least one second electrode series. The first conducting wire in each of the first groups is coupled to the second electrode series in one of the serial groups. The second conducting wire in each of the second groups is coupled to the second electrode series in another one of the serial groups. The serial groups which are coupled to the first groups are not adjacent to one another, and the serial groups which are coupled to the second groups are not adjacent to one another.

In an embodiment as shown in FIG. 5, the conducting wires 12a and the conducting wires 12c are defined as a first group G1. The conducting wire 12b and the conducting wire 12d are defined as a second group G2. The conducting wire 12a 與 conducting wire 12c are coupled to the pad at the first end of the corresponding second electrode series. The conducting wire 12b and the conducting wire 12d are coupled to the pad at the second end of the corresponding second electrode series. In practice, the first groups or the second groups can include more first conducting wires or more second conducting wires. In practice, there can be more first groups and more second groups defined on the display panel. In an embodiment, each of the first groups and each of the second groups are coupled to the corresponding second electrode series in the order as shown in FIG. 5. The first group is correspondingly coupled to second electrode series on the left side, and the second group is correspondingly coupled to second electrode series on the right side. This disclosure does not intend to limit the coupled order of each first group, each second group and each second electrode series. After referring to this specification, person having ordinary skill in the art can design the coupled order and adjust the layout of conducting wires.

Figure 6:
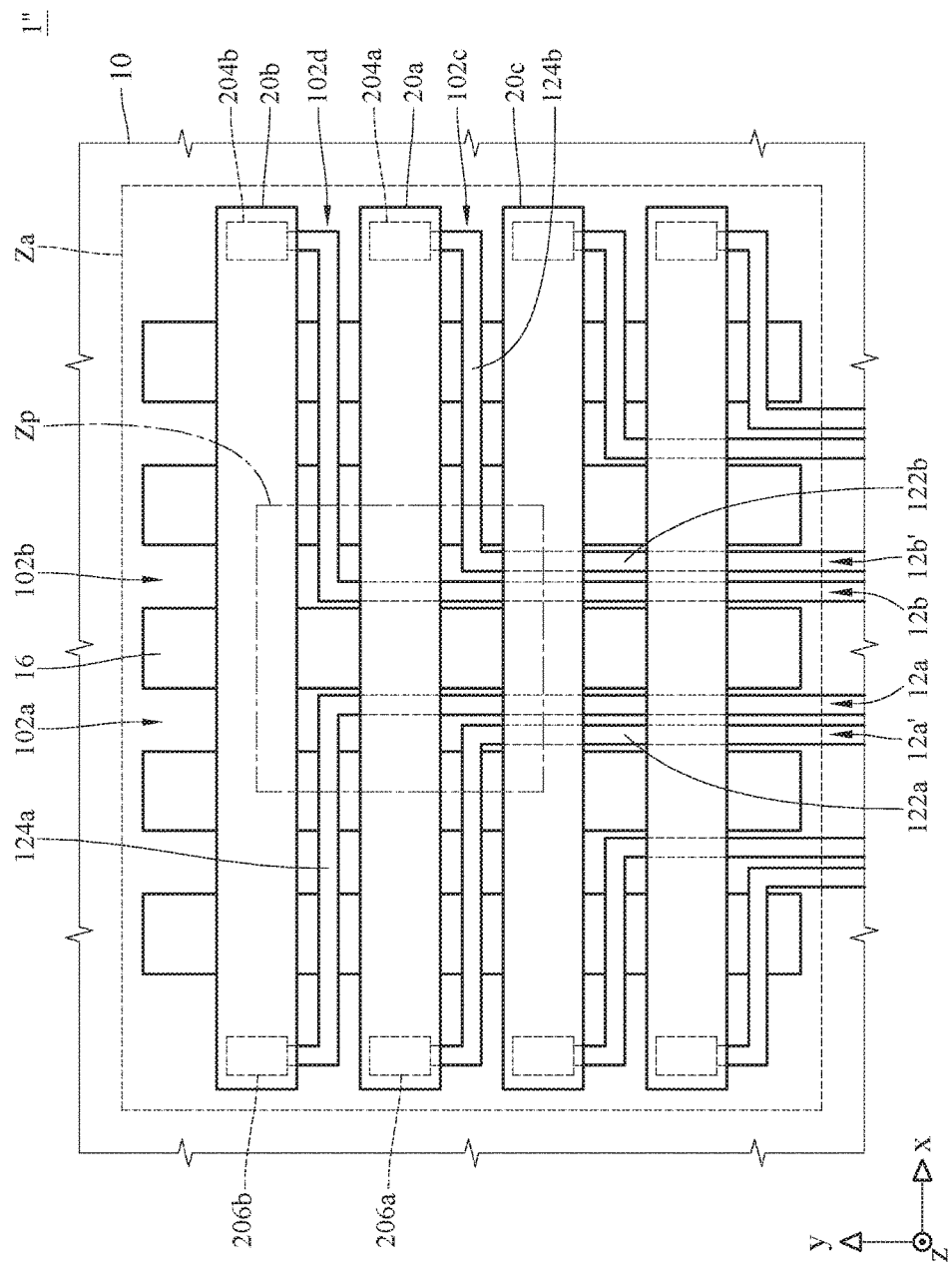
FIG. 6 is a schematic diagram of relationship between part units of a display panel in yet another embodiment of this disclosure.

Please refer to FIG. 6, a schematic diagram of relationship between part units of a display panel in yet another embodiment of this disclosure. The structure of the display panel 1" shown in FIG. 6 is similar to the display panel 1 mentioned before, so the details of related units are not described again. As shown in FIG. 6, each of the first groups includes multiple first conducting wires and the first conducting wires in each of the plurality of first groups are adjacent to one another. Each of the second groups includes multiple second conducting wires and the second conducting wires in each of the plurality of second groups are adjacent to one another. Each of the serial groups includes multiple second electrode series and the second electrode series in each of the serial groups are adjacent to one another. In other words, the first end of each of the second electrode series is coupled to one first conducting wire, and the second end of each of the second electrode series is coupled to one second conducting wires. As a result, mura effect, which describes almost irregular luminosity variation defects in displays, of display panel can be avoided. Besides, multiple conducting wires can be disposed in the same interval zone. As shown in FIG. 6, the conducting wires 12a and the conducting wires 12a' are disposed in the interval zone 102a. In other words, multiple conducting wires can be disposed between any two adjacent first electrode series. In another embodiment, multiple conducting wires can be disposed between any two adjacent second electrode series. The relationship between the conducting wire 12b and the conducting wire 12b' is similar to the relationship between the conducting wire 12a and the conducting wire 12a', so the related details are not described again.

In view of the above statement, this disclosure provides a display panel which includes conducting wires to drive light emitting units to emit light selectively. In conventional display panels, the layout of conducting wires is outside display zone and the trace is routed using the space outside the display zone. Hence, the border width of the display panel is increased. In the display panel provided in this disclosure, by disposing the conducting wires in the interval zones of the display panel to make the conducting wires in the display zone, the space outside the display zone will not be used for the layout of the conducting wires. Besides the border width of the display panel reduced, the width of the conducting wires will not narrow according to the space outside the display zone. As a result, this disclosure solves the problems, breaks in surrounding traces or poor quality, which result from reducing the trace width for narrow border. Then, the intervals and the width of surrounding traces become smaller and smaller. Therefore, manufacturing display panels by conventional methods easily causes the problems such as too narrow width of surrounding traces or breaks in surrounding traces and decreases the quality of display panels While this disclosure is described in terms of several embodiments above, these embodiments do not intend to limit this disclosure. It is therefore intended that the following appended claims be interpreted as including all such alterations, permutations, and equivalents as fall within the true spirit and scope of the present disclosure.

What is claimed is:

1. A display panel, comprising:
   a substrate having a plurality of interval zones and a plurality of light emitting zones defined on the substrate;
   a first insulation layer disposed on the substrate;
   a plurality of conducting wires disposed on the first insulation layer, wherein each of the plurality of conducting wires comprises:
      a first trace part extending along a first direction, wherein part of the first trace part is disposed in one of the plurality of interval zones; and
      a second trace part extending along a second direction, and disposed in one of the plurality of interval zones, wherein a first end of the second trace part is connected to the first trace part;
   a second insulation layer disposed on the substrate, in the plurality of interval zones of the substrate, and covering the plurality of conducting wires and the first insulation layer;
   a plurality of first electrode series, wherein each of the plurality of first electrode series extends along the first direction and comprises a plurality of first electrode units, and each of the plurality of first electrode units is correspondingly in one of the plurality of light emitting zones;
   a plurality of light emitting units disposed in the plurality of light emitting zones and on the plurality of first electrode units of the plurality of first electrode series; and
   a plurality of second electrode series extending along the second direction, and covering the plurality of light emitting units in the plurality of light emitting zones, wherein each of the plurality of second electrode series comprises at least one pad;
   wherein a second end of the second trace part of each of the plurality of conducting wires is connected to the pad of one of the plurality of second electrode series.

2. The display panel according to claim 1, wherein the first insulation layer covers part of the plurality of first electrode series.

3. The display panel according to claim 2, wherein the plurality of second electrode series comprises a plurality of second electrode units, and each of the plurality of second electrode units is correspondingly disposed on one of the plurality of light emitting units.

4. The display panel according to claim 3, wherein the plurality of conducting wires, the plurality of first electrode series and the plurality of second electrode series are isolated from one another.

5. The display panel according to claim 1, further comprising a plurality of isolating units, wherein the plurality of isolating units are disposed up the plurality of first electrode series and the first insulation layer, and each of a plurality of isolating units extends along the second direction.

6. The display panel according to claim 1, wherein the second trace part of each of the plurality of conducting wires is under one of a plurality of isolating units.

7. The display panel according to claim 1, wherein the plurality of conducting wires are disposed among the plurality of first electrode series.

8. The display panel according to claim 1, wherein the plurality of conducting wires are disposed among the plurality of second electrode series.

9. The display panel according to claim 1, wherein each of the plurality of second electrode series comprises a first end and a second end, the plurality of conducting wires are defined as the plurality of first conducting wires and the plurality of second conducting wires respectively, each of the plurality of first conducting wires is coupled to the pad at the first end of one of the plurality of second electrode series, and each of the plurality of second conducting wires is coupled to the pad at the second end of one of the plurality of second electrode series.

10. The display panel according to claim 9, wherein the plurality of first conducting wires are adjacent to one another, and the plurality of second conducting wires are adjacent to one another.

11. The display panel according to claim 10, wherein the pad at the first end of each of the plurality of second electrode series is coupled to one of the plurality of first conducting wires, and the pad at the second end of each of the plurality of second electrode series is coupled to one of the plurality of second conducting wires.

12. The display panel according to claim 10, wherein the plurality of the second electrode series coupled to the plurality of first conducting wires are not adjacent to one another, and the plurality of second electrode series coupled to the plurality of second conducting wires are not adjacent to one another.

13. The display panel according to claim 10, wherein the plurality of first conducting wires are further divided into a plurality of first groups, each of the plurality of first groups comprises at least one first conducting wire, the plurality of second conducting wires are further divided into a plurality of second groups, each of the plurality of second groups comprises at least one second conducting wire respectively, the plurality of second electrode series are further divided into a plurality of serial groups, each of the plurality of serial groups comprises at least one second electrode series, the at least one first conducting wire in each of the plurality of first groups is coupled to the at least one second electrode series in one of the plurality of serial groups, the at least one second conducting wire in each of the plurality of second groups is coupled to the at least one second electrode series in another one of the plurality of serial groups, the plurality of serial groups coupled to the plurality of first groups are not adjacent to one another, and the plurality of serial groups coupled to the plurality of second groups are not adjacent to one another.

14. The display panel according to claim 13, wherein each of the plurality of first groups comprises a plurality of first conducting wires, the plurality of first conducting wires in each of the plurality of first groups are adjacent to one another, each of the plurality of second groups comprises a plurality of second conducting wires, the plurality of second conducting wires in each of the plurality of second groups are adjacent to one another, each of the plurality of serial groups comprises a plurality of second electrode series, and the plurality of second electrode series in each of the plurality of serial groups are adjacent to one another.

* * * * *